(12) United States Patent
Jun

(10) Patent No.: US 10,891,899 B2
(45) Date of Patent: Jan. 12, 2021

(54) DISPLAY DEVICE, ELECTRONIC DEVICE, AND BODY-BIASING CIRCUIT

(71) Applicant: LG Display Co., Ltd., Seoul (KR)

(72) Inventor: Jaehun Jun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 16/051,196

(22) Filed: Jul. 31, 2018

(65) Prior Publication Data

US 2019/0051245 A1 Feb. 14, 2019

(30) Foreign Application Priority Data

Aug. 9, 2017 (KR) .................. 10-2017-0101323

(51) Int. Cl.
| | |
|---|---|
| *G06F 1/00* | (2006.01) |
| *G09G 3/3258* | (2016.01) |
| *H01L 29/786* | (2006.01) |
| *G09G 3/3233* | (2016.01) |
| *G09G 3/3225* | (2016.01) |

(Continued)

(52) U.S. Cl.
CPC .......... *G09G 3/3258* (2013.01); *G09G 3/003* (2013.01); *G09G 3/3225* (2013.01); *G09G 3/3233* (2013.01); *H01L 27/3297* (2013.01); *H01L 29/78615* (2013.01); *H01L 51/5206* (2013.01); *H01L 51/5221* (2013.01); *G09G 2300/0426* (2013.01); *G09G 2300/0465* (2013.01); *G09G 2300/0842* (2013.01); *G09G 2310/0264* (2013.01); *G09G 2310/0291* (2013.01); *G09G 2320/0233* (2013.01); *G09G 2320/0295* (2013.01); *G09G 2320/043* (2013.01); *G09G 2330/028* (2013.01)

(58) Field of Classification Search
CPC .......... G09G 3/30; G09G 5/00; G09G 3/3258; G09G 3/3233; G09G 5/10; H01L 51/52; H01L 27/32; G06F 3/038
See application file for complete search history.

(56) References Cited

U.S. PATENT DOCUMENTS

| | | | |
|---|---|---|---|
| 9,047,813 | B2 | 6/2015 | Minami et al. |
| 9,318,045 | B2 | 4/2016 | Kasai |

(Continued)

FOREIGN PATENT DOCUMENTS

| | | |
|---|---|---|
| EP | 1 045 436 A1 | 10/2000 |
| JP | 2005-215609 A | 8/2005 |

(Continued)

OTHER PUBLICATIONS

Office Action, Japanese Patent Application No. 2018-148959, dated Jul. 9, 2019, 8 pages.

(Continued)

*Primary Examiner* — Michael A Faragalla
(74) *Attorney, Agent, or Firm* — Fenwick & West LLP

(57) ABSTRACT

Embodiments disclosed herein relate to a display device, an electronic device, and a body-biasing circuit, and more particularly, to a display device, an electronic device, and a body biasing circuit, in which even if a common voltage is fluctuated due to noise, image quality degradation due to the fluctuation of the common voltage can be prevented through a body-biasing technique that applies a body voltage corresponding to the common voltage to a body of a driving transistor in a sub-pixel.

10 Claims, 17 Drawing Sheets

(51) Int. Cl.
  *G09G 3/00*    (2006.01)
  *H01L 27/32*   (2006.01)
  *H01L 51/52*   (2006.01)

(56)         References Cited

U.S. PATENT DOCUMENTS

| | | |
|---|---|---|
| 2004/0233147 A1 | 11/2004 | Kawachi et al. |
| 2008/0048945 A1 | 2/2008 | Jo et al. |
| 2010/0220118 A1* | 9/2010 | Kanegae ............... G09G 3/3233 345/690 |
| 2012/0169798 A1* | 7/2012 | Ebisuno ................. G09G 3/325 345/690 |
| 2012/0313923 A1 | 12/2012 | Minami et al. |
| 2012/0327058 A1* | 12/2012 | Minami ............... G09G 3/3225 345/211 |
| 2013/0038585 A1 | 2/2013 | Kasai |

FOREIGN PATENT DOCUMENTS

| | | |
|---|---|---|
| JP | 2007-183385 A | 7/2007 |
| JP | 2013-3568 A | 1/2013 |
| JP | 2013-37261 A | 2/2013 |
| JP | 2013-131608 A | 7/2013 |

OTHER PUBLICATIONS

European Patent Office, Extended European Search Report and Opinion, EP Patent Application No. 18186953.8, dated Jan. 2, 2019, 19 pages.
Partial European Search Report, European Patent Application No. 18186953.8, dated Oct. 19, 2018, 14 pages.

* cited by examiner

FIG.11
(case 1)
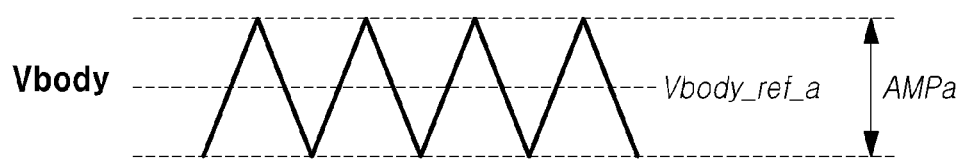
(case 2)

DISPLAY DEVICE, ELECTRONIC DEVICE, AND BODY-BIASING CIRCUIT

CROSS REFERENCE TO RELATED APPLICATION

This application claims priority from Republic of Korea Patent Application No. 10-2017-0101323, filed on Aug. 9, 2017, which is hereby incorporated by reference for all purposes as if fully set forth herein.

BACKGROUND

Related Field

The present disclosure relates to a display device, an electronic device, and a body-biasing circuit.

Description of the Prior Art

As a society develops into an information society, demand for display devices for displaying images is increasing in various forms. In recent years, various display devices such as a liquid crystal display device, a plasma display device, and an Organic Light-Emitting Diode (OLED) display device have been utilized.

In a display device, various driving voltages are applied to sub-pixels. Among these various voltages, there is a common voltage that is commonly applied to all the sub-pixels.

This common voltage is a DC voltage having a constant voltage value, but the voltage value may fluctuate due to noise generated during generation.

As described above, the fluctuation of the common voltage due to noise may unnecessarily change the electrical characteristics (e.g., current, capacitance, etc.) for image display of the sub-pixels, resulting in a problem of degrading image quality.

However, the fluctuation of the common voltage is caused by unexpected noise generated in during voltage generation, and may be a phenomenon that cannot be prevented or controlled.

Therefore, image quality degradation due to fluctuation of the common voltage due to noise is recognized as a serious problem that is hardly solved in the display field.

SUMMARY

In view of the foregoing, an aspect of embodiments disclosed herein is to provide a display device, an electronic device, and a body-biasing circuit, in which, even when fluctuation of a common voltage occurs due to noise, degredation of image quality due to the fluctuation of the common voltage can be prevented.

Another aspect of embodiments disclosed herein is to provide a display device, an electronic device, and a body-biasing circuit, in which, even when fluctuation of a common voltage occurs due to noise, an increase in a variation width of current flowing to an OLED due to the fluctuation of the common voltage can be prevented.

Another aspect of embodiments disclosed herein is to provide a display device, an electronic device, and a body-biasing circuit that can be applied to a virtual reality device or an augmented reality device and provide excellent image quality.

Embodiments disclosed herein may provide a display device including a pixel array including a plurality of sub-pixels defined by a plurality of data lines and a plurality of gate lines and driving circuits configured to drive the pixel array.

The driving circuits may include a source driving circuit configured to the plurality of data lines and a gate driving circuit configured to drive the plurality of gate lines.

The driving circuits may further include a controller configured to control the source driving circuit and the gate driving circuit.

In the display device, a body voltage corresponding to a common voltage commonly applied to the plurality of sub-pixels may be applied to a body of a driving transistor in each of the plurality of sub-pixels.

The body voltage may have a waveform corresponding to a waveform of the common voltage.

The body voltage may have an amplitude that varies according to a variation of an amplitude of the common voltage.

Each of the plurality of sub-pixels may include an OLED driven by the driving transistor and having an anode electrode and a cathode electrode.

In this case, the common voltage may be a base voltage (cathode voltage) applied to the cathode electrode of an OLED.

The display device according to embodiments disclosed herein may further include a power supply circuit configured to output the common voltage, and a body-biasing circuit connected between the body of the driving transistor and the power supply circuit and configured to apply the body voltage corresponding to the common voltage to the body of the driving transistor.

The body-biasing circuit may include a voltage distribution circuit configured to output a distributed voltage between a driving voltage applied to a drain node or a source node of the driving transistor and the common voltage, and an output circuit configured to output the body voltage corresponding to the distributed voltage or the body voltage obtained by amplifying the distributed voltage to the body of the driving transistor.

The power supply circuit may include a DC-DC converter.

Meanwhile, the driving voltage (base voltage) output from the power supply circuit may be directly applied to the body of the driving transistor.

Thus, the power supply circuit may supply the common voltage to the cathode electrode of the OLED, and may further supply a body voltage corresponding to the common voltage to the body of the driving transistor.

The pixel array may be disposed on a glass substrate.

Alternatively, the pixel array may be disposed on a silicon substrate (silicon semiconductor substrate). In this case, circuits such as the source driving circuit, the gate driving circuit, and the controller as well as the pixel array may also be disposed on the silicon substrate.

Embodiments disclosed herein may provide an electronic device including an image signal input unit to which an image signal is input, a first display unit configured to display a first image based on the image signal, a second display unit configured to display a second image based on the image signal, and a case configured to accommodate the image signal input unit, the first display unit, and the second display unit therein.

Each of the first display unit and the second display unit may be a display device according to embodiments disclosed herein or a portion thereof.

Each of the first display unit and the second display unit may include a silicon substrate, a pixel array including a plurality of sub-pixels arranged on the silicon substrate, and driving circuits disposed on the silicon substrate.

The driving circuits, which are disposed on the silicon substrate, may be located around the pixel array.

In the electronic device according to embodiments disclosed herein, a body voltage corresponding to a common voltage commonly applied to the plurality of sub-pixels may be applied to a body of a driving transistor in each of the plurality of sub-pixels.

The electronic device according to embodiments disclosed herein may further include a power supply circuit configured to output the common voltage, and a body-biasing circuit connected between the body of the driving transistor and the power supply circuit and configured to apply the body voltage corresponding to the common voltage to the body of the driving transistor.

The body-biasing circuit may be present to correspond to each of the first display unit and the second display unit.

Alternatively, the body-biasing circuit may be commonly present in the first display unit and the second display unit.

The body-biasing circuit may include a voltage distribution circuit configured to output a distributed voltage between a driving voltage applied to a drain node or a source node of the driving transistor and the common voltage, and an output circuit configured to output the body voltage corresponding to the distributed voltage or the body voltage obtained by amplifying the distributed voltage to the body of the driving transistor.

The driving transistor in the pixel array may be of a Metal-Oxide-Semiconductor Field-Effect Transistor (MOSFET) type fabricated in a semiconductor process.

The electronic device according to embodiments disclosed herein may be a Virtual Reality (VR) device or an Augmented Reality (AR) device.

Embodiments disclosed herein may provide a body-biasing circuit including a voltage distribution circuit configured to output a distributed voltage between a driving voltage for driving the sub-pixel and a base voltage, and an output circuit configured to output the distributed voltage or a voltage obtained by amplifying the distributed voltage to a body of the driving transistor in the sub-pixel.

The voltage distribution circuit may include a resistor string connected between the driving voltage and the base voltage, and a switching circuit configured to connect one point of a plurality of points in the resistor string to an input node of the output circuit.

According to embodiments disclosed herein, it is possible to provide a display device, an electronic device, and a body-biasing circuit, in which, even when fluctuation of a common voltage occurs due to noise, image quality degradation due to the fluctuation of the common voltage can be prevented.

According to embodiments disclosed herein, it is possible to provide a display device, an electronic device, and a body-biasing circuit, in which, even when fluctuation of a common voltage occurs due to noise, an increase in a variation width of the current flowing in an OLED due to the fluctuation of the common voltage can be prevented.

According to embodiments disclosed herein, it is possible to provide a display device, an electronic device, and a body-biasing circuit that can be applied to a virtual reality device or an augmented reality device and provide excellent image quality.

BRIEF DESCRIPTION OF THE DRAWINGS

The above and other aspects, features and advantages of the present disclosure will be more apparent from the following detailed description taken in conjunction with the accompanying drawings, in which:

FIG. 11 illustrates examples of body voltage of a driving transistor when a body-biasing circuit for an adaptive body-biasing technique is applied in an OLED display device according to embodiments disclosed herein;

DETAILED DESCRIPTION

Figure 1:
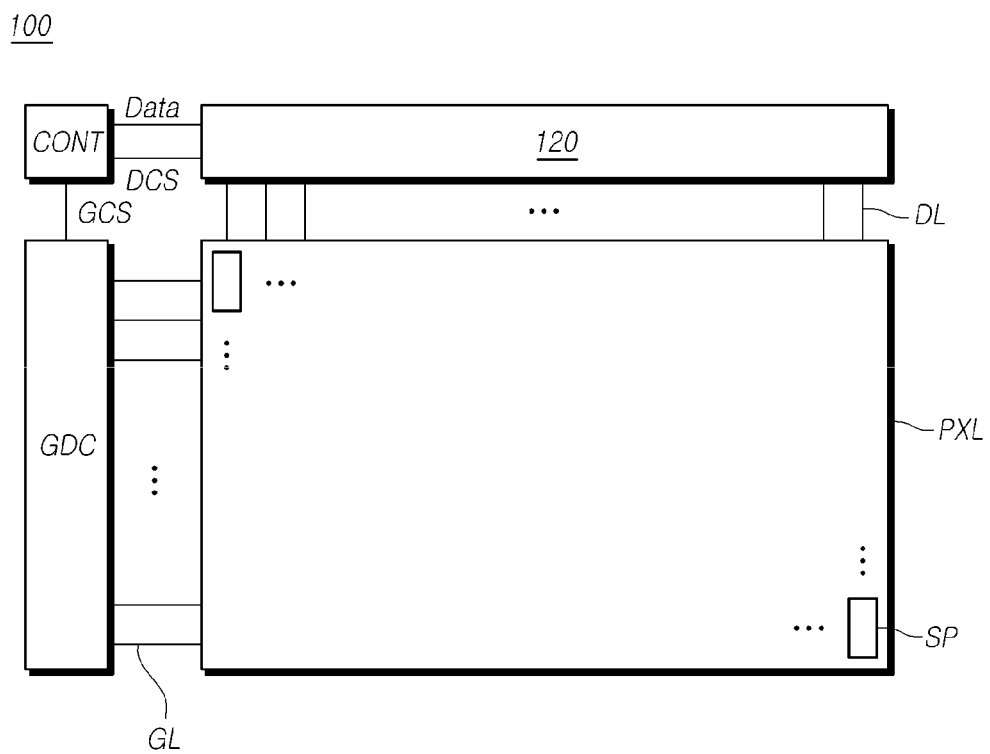
FIG. 1 is a diagram illustrating a system configuration of an OLED display device according to embodiments disclosed herein.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Embodiments disclose a body-biasing circuit and a display device including the body-biasing circuit, in which, even when a fluctuation of a common voltage occurs due to noise, image quality can be prevented from being deteriorated due to the fluctuation of the common voltage.

Embodiments also disclose an electronic device that provides a realistic virtual reality or augmented reality to a user using a body-biasing circuit and a display device.

A display device according to embodiments may be various types of displays such as a liquid crystal display device, a plasma display device, and an OLED display device. Hereinafter, an OLED display device will be described by way of an example.

FIG. 1 is a diagram illustrating a system configuration of an OLED display device 100 according to embodiments.

Referring to FIG. 1, an OLED display device 100 according to embodiments disclosed herein includes: a pixel array PXL in which a plurality of data lines DL and a plurality of gate lines GL are arranged, the pixel array PXL including a plurality of sub-pixels SP defined by the plurality of data lines DL and the plurality of gate lines GL; a source driving circuit SDC configured to drive the drive lines DL; a gate driving circuit GDC configured to drive the plurality of gate lines GL; a controller (CONT) configured to control the SDC and the GDC; and the like.

The controller CONT supplies various control signals DCS and GCS to the source driving circuit SDC and the gate driving circuit GDC so as to control the source driving circuit SDC and the gate driving circuit GDC.

The controller CONT starts scanning according to timing implemented in each frame, converts input image data input from the outside to be suitable for a data signal form used in the source driving circuit SDC, thereby outputting converted image data Data, and controls data driving at a proper time to suit the scanning.

The controller CONT may be a timing controller that is used in a typical display technique, or a control device that additionally performs other control functions, including the timing controller function.

The controller CONT may be implemented as a component separate from the source driving circuit SDC, or as an integrated circuit by being integrated with the source driving circuit SDC.

The source driving circuit SDC receives the image data Data input from the controller CONT and supplies a data voltage to the plurality of data lines DL so as to drive the plurality of data lines DL. Here, the source driving circuit SDC is also referred to as a source driving circuit.

The source driving circuit SDC may be implemented by including at least one Source Driver Integrated Circuit (SDIC).

Each SDIC may include a shift register, a latch circuit, a Digital to Analog Converter (DAC), an output buffer, etc.

Each SDIC may further include an Analog to Digital Converter (ADC) in some instances.

The gate driving circuit GDC sequentially supplies scan signals to the plurality of gate lines GL so as to sequentially drive the plurality of gate lines GL. Here, the gate driving circuit GDC is also referred to as a scan driving circuit.

The gate driving circuit GDC may be implemented by including at least one GDIC.

Each GDIC may include a shift register, a level shifter, and the like.

The gate driving circuit GDC sequentially supplies a scan signal of an On-voltage or an Off-voltage to the plurality of gate lines GL under the control of the controller CONT.

When a specific gate line is opened by the gate driving circuit GDC, the source driving circuit SDC converts image data Data received from the controller CONT into an analog data voltage and supplies the analog data voltage to the plurality of data lines DL).

The source driving circuit SDC may be located only on one side (e.g., the upper side or the lower side) of the pixel array PXL and may be located on both sides (e.g., the upper side and the lower side) of the pixel array PXL depending on a panel driving scheme, a panel design scheme, etc., in some cases.

The gate driving circuit GDC may be located only on one side (e.g., the left side or the right side) of the pixel array PXL and may be located on both sides (e.g., the left side and the right side) of the pixel array PXL depending on a panel driving scheme, a panel design scheme, etc., in some cases.

The types and the number of the circuit elements constituting each sub-pixel SP may be variously determined according to provided functions, a design scheme, and the like.

On the other hand, the pixel array PXL may exist in a display panel using a glass substrate or the like, and the source driving circuit SDC and the gate driving circuit GDC may be electrically connected to the display panel in various ways.

That is, in the OLED display device 100, transistors, various electrodes, various signal lines, and the like are foiled on a glass substrate so as to form a pixel array PXL, and the integrated circuits corresponding to the driving circuits are mounted on a printed circuit and electrically connected to the display panel through the printed circuit. Such an existing structure is suitable for medium and large-sized display devices.

Meanwhile, the OLED display device 100 according to the embodiments may be a small display device having a structure suitable to be applied to electronic devices such as a virtual reality device and an augmented reality device, or having excellent display performance.

In this case, for example, the pixel array PXL, the source driving circuit SDC, the gate driving circuit GDC, and the controller CONT may be arranged together on a silicon substrate (a silicon semiconductor substrate).

In this case, the OLED display device 100 may be manufactured in a very small size, and may be used in electronic devices such as a Virtual Reality (VR) device or an Augmented Reality (AR) device.

Figure 2:
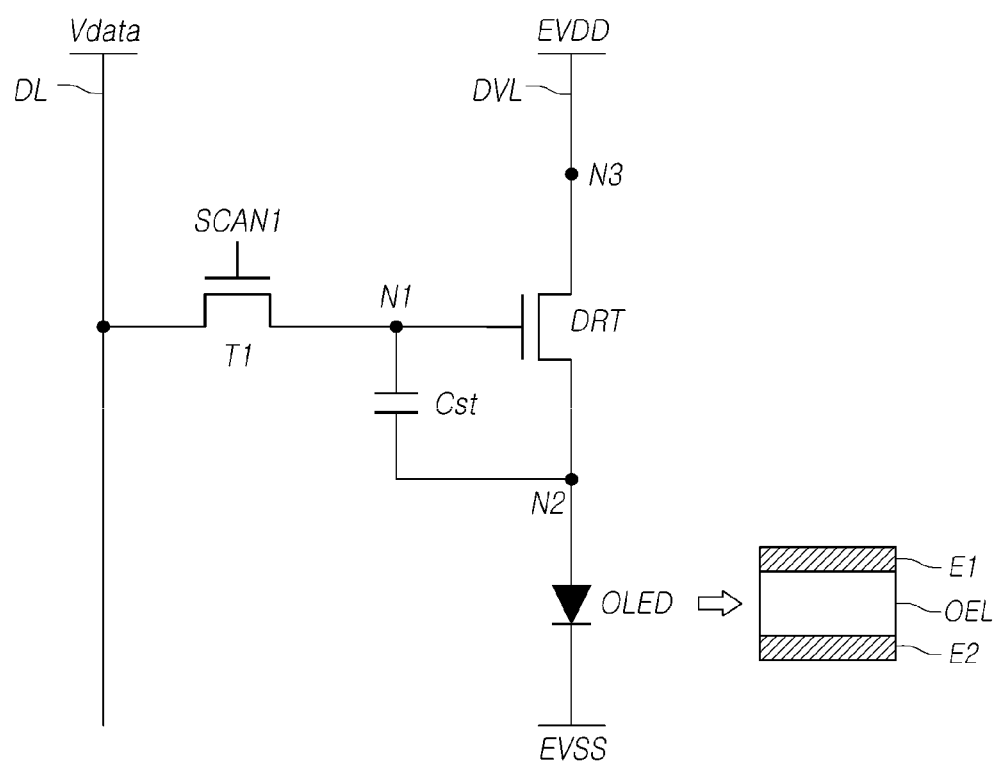
FIG. 2 is a diagram illustrating a sub-pixel structure of an OLED display device according to embodiments disclosed herein.
Figure 3:
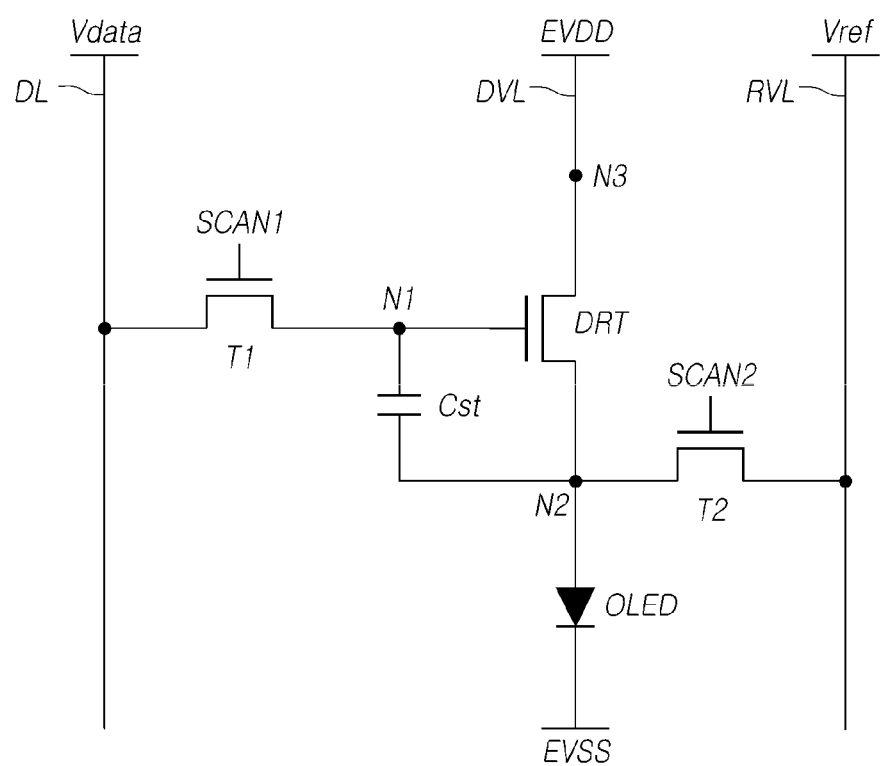
FIG. 3 is a diagram illustrating another sub-pixel structure of an OLED display device according to embodiments disclosed herein.

FIG. 2 illustrates a sub-pixel structure of the OLED display device 100 according to the embodiments, and FIG. 3 is another sub-pixel structure of the OLED display device 100 according to the embodiments.

Referring to FIG. 2, in the OLED display device 100 according to the embodiments, each sub-pixel SP may include an organic light-emitting diode (OLED), a driving transistor DRT configured to drive the OLED, a first transistor T1 electrically connected between a first node N1 of the driving transistor DRT and a data line DL, and a capacitor Cst electrically connected between the first node N1 and a second node N2 of the driving transistor DRT.

The OLED may include a first electrode E1 (e.g., an anode electrode or a cathode electrode), an organic light-emitting layer OEL, a second electrode E2 (e.g., a cathode electrode or an anode electrode), etc.

The first electrode E1 of the OLED may be electrically connected to the second node N2 of the driving transistor DRT. A ground voltage EVSS may be applied to the second electrode E2 of the OLED.

Here, the base voltage EVSS may be a common voltage Vcom applied to all the sub-pixels SP.

The driving transistor DRT drives the OLED by supplying driving current Ioled to the OLED.

The driving transistor DRT has a first node N1, a second node N2, and a third node N3.

The first node N1 of the driving transistor DRT is a node corresponding to a gate node, and may be electrically connected to a source node or a drain node of the first transistor T1.

The second node N2 of the driving transistor DRT may be electrically connected to the first electrode of the OLED, and may be a source node or a drain node.

A third node N3 of the driving transistor DRT may be a node to which a driving voltage EVDD is applied, and may be electrically connected to a driving voltage line DVL that supplies the driving voltage EVDD. The third node N3 may be a drain node or a source node.

Here, the driving voltage EVDD may be the common voltage Vcom applied to all the sub-pixels SP.

The first transistor T1 may be subjected to on-off control by receiving a first scan signal SCANT with the gate node through the gate line.

The first transistor T1 may be turned on by the first scan signal SCANT so as to transmit the data voltage Vdata supplied from the data line DL to the first node N1 of the driving transistor DRT.

The first transistor T1 is also referred to as a switching transistor.

The capacitor Cst is electrically connected between the first node N1 and the second node N2 of the driving transistor DRT so as to keep the data voltage Vdata corresponding to the image signal voltage or a voltage corresponding thereto for one frame time.

As described above, one sub-pixel SP illustrated in FIG. 2 may have a 2T1C structure including two transistors DRT and T1 and one capacitor Cst in order to drive the OLED.

The sub-pixel structure (2T1C structure) illustrated in FIG. 2 is merely an example for convenience of explanation, and one sub-pixel SP may further include one or more transistors, or may further include one or more capacitors depending on a function, a panel structure, or the like.

FIG. 3 is a diagram illustrating a 3T1C structure in which one sub-pixel SP further including a second transistor T2 electrically connected between the second node N2 of the driving transistor DRT and the reference voltage line RVL, as an example.

Referring to FIG. 3, the second transistor T2 is electrically connected between the second node N2 of the driving transistor DRT and the reference voltage line RVL and receives a second scan signal SCAN2 with the gate node, thereby being subjected to on-off control.

The drain node or source node of the second transistor T2 may be electrically connected to the reference voltage line RVL, and the source node or drain node of the second transistor T2 may be electrically connected to the second node N2 of the driving transistor DRT.

The second transistor T2 may be turned on during, for example, a display driving time period, and may be turned on during a sensing driving time period for sensing a characteristic value of the driving transistor DRT or a characteristic value of the OLED.

The second transistor T2 may be turned on by the second scan signal SCAN2 in accordance with the corresponding driving timing so as to deliver the reference voltage Vref supplied to the reference voltage line RVL, to the second node N2 of the driving transistor DRT.

The second transistor T2 may be turned on by the second scan signal SCAN2 in accordance with another driving timing so as to deliver the voltage of the second node N2 of the driving transistor DRT to the reference voltage line RVL.

In this case, a sensing unit (e.g., an analog digital converter) that may be electrically connected to the reference voltage line RVL is able to measure the voltage of the second node N2 of the driving transistor DRT through the reference voltage line RVL.

In other words, the second transistor T2 may control the voltage state of the second node N2 of the driving transistor DRT or may deliver the voltage of the second node N2 of the driving transistor DRT to the reference voltage line RVL.

Meanwhile, the capacitor Cst is not a parasitic capacitor (e.g., Cgs or Cgd) which is an internal capacitor existing between the first node N1 and the second node N2 of the driving transistor DRT, but an external capacitor intentionally designed outside the driving transistor DRT.

Each of the driving transistor DRT, the first transistor T1, and the second transistor T2 may be an n-type transistor or a p-type transistor.

Meanwhile, the first scan signal SCANT and the second scan signal SCAN2 may be separate gate signals. In this case, the first scan signal SCANT and the second scan signal SCAN2 may be respectively applied to the gate node of the first transistor T1 and the gate node of the second transistor T2 through different gate lines.

In some cases, the first scan signal SCANT and the second scan signal SCAN2 may be the same gate signal. In this case, the first scan signal SCANT and the second scan signal SCAN2 may be commonly applied to the gate node of the first transistor T1 and the gate node of the second transistor T2 through the same gate line.

Each of the sub-pixel structures illustrated in FIGS. 2 and 3 is merely an example, and may further include one or more transistors or, in some cases, one or more capacitors.

Alternatively, the plurality of respective sub-pixels may have the same structure, and some of the plurality of sub-pixels may have different structures.

Figure 4:
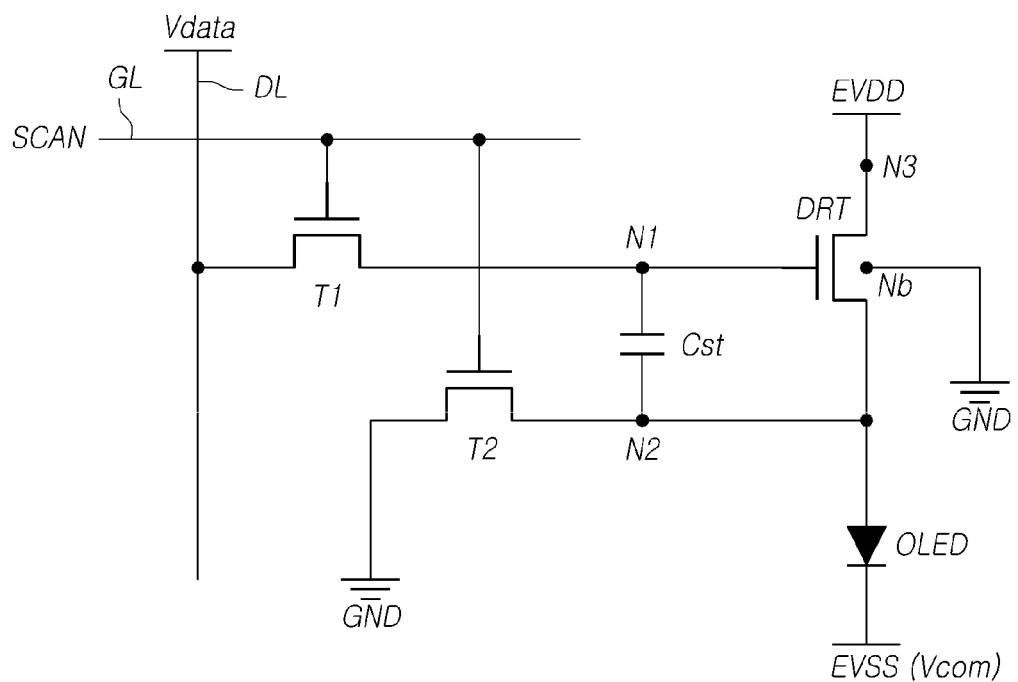
FIG. 4 is a diagram illustrating still another sub-pixel structure of an OLED display device according to embodiments disclosed herein.

FIG. 4 illustrates still another sub-pixel structure of the OLED display device 100 according to the embodiments.

The sub-pixel structure of FIG. 4 is a variation of the 3T1C structure of FIG. 3.

In the case of the sub-pixel structure of FIG. 4, the gate node of the first transistor T1 and the gate node of the second transistor T2 are connected to the same gate line GL so as to receive the same scan signal SCAN.

In addition, a ground voltage GND is applied to the drain node or the source node of the second transistor T2 as the reference voltage Vref.

In the case of the sub-pixel structure of FIG. 4, the body Nbody of the driving transistor DRT is applied with the ground voltage GND of a constant voltage type.

Hereinafter, the sub-pixel structure of FIG. 4 will be described by way of an example. However, the present disclosure is not limited thereto.

Figure 5:
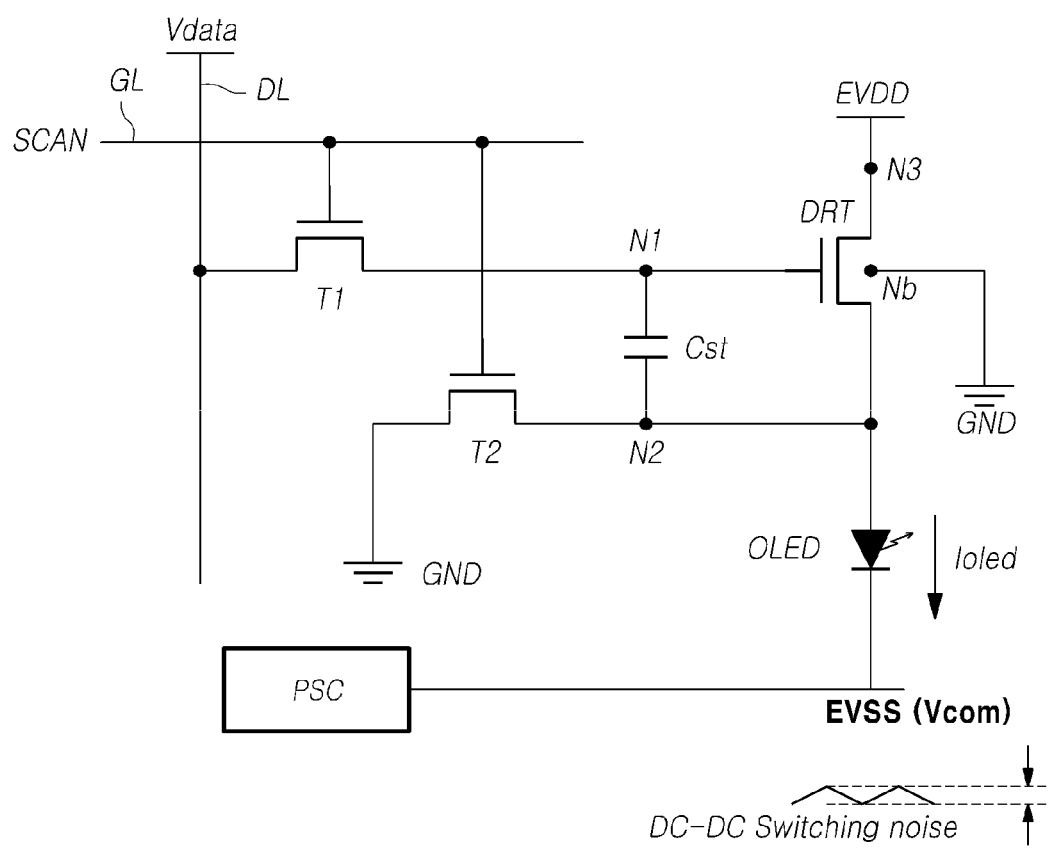
FIG. 5 is a diagram illustrating a power supply circuit configured to supply a base voltage which is a common voltage and noise generation of a base voltage in an OLED display device according to embodiments disclosed herein.
Figure 6:
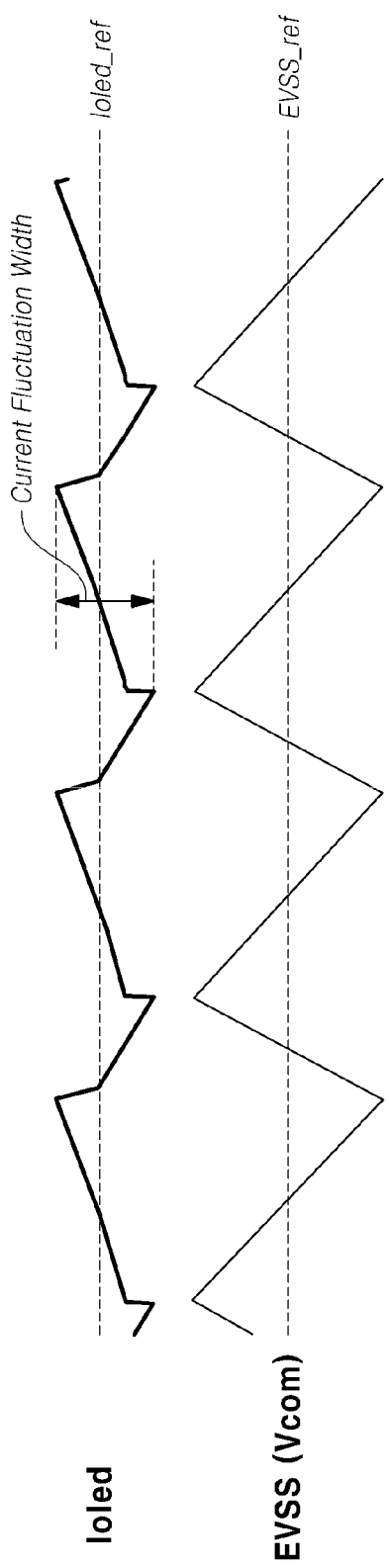
FIG. 6 is a diagram illustrating a base voltage in which noise occurs and a variation of current according to the noise of the base voltage in an organic light-emitting diode in an OLED display device according to embodiments disclosed herein.

FIG. 5 is a diagram illustrating a power supply circuit PSC configured to supply a base voltage EVSS, which is a common voltage Vcom, and noise occurrence of the base voltage EVSS in the OLED display device 100 according to the embodiments. FIG. 6 is a diagram illustrating a base voltage EVSS in which noise occurs and a variation of the current of an OLED according to the noise of the base voltage EVSS in the OLED display 100 according to the embodiments.

Referring to FIG. 5, the OLED display device 100 according to the embodiments may further include a power supply circuit PSC.

The power supply circuit PSC may supply the base voltage EVSS corresponding to the common voltage Vcom to the pixel array 110.

Here, for example, in the case of the OLED display device 100, the common voltage Vcom may be the base voltage EVSS. However, in the case of a liquid crystal display, the common voltage Vcom may be a common voltage applied to a common electrode that forms a capacitance with a pixel electrode in each sub-pixel.

The power supply circuit PSC may output a voltage required for driving the pixel array PXL, a voltage required for operating the source driving circuit SDC, a voltage required for operating the gate driving circuit GDC, a voltage required for operating the controller CONT, and the like.

This power supply circuit PSC may include one or more power-related circuits.

Meanwhile, the base voltage EVSS output from the power supply circuit PSC may be in the form of a DC voltage.

The base voltage EVSS supplied from the power supply circuit PSC is a voltage to be applied to the second electrode E2 (e.g., the cathode electrode) of the OLED and corresponds to a common voltage Vcom commonly applied to all the sub-pixels SP.

Meanwhile, the power supply circuit PSC may be constituted by a DC-DC converter.

Here, the DC-DC converter may be an electronic circuit device that converts a DC power of a certain voltage into a DC power of a different voltage.

Referring to FIGS. 5 and 6, the base voltage EVSS output from the DC-DC converter should be a DC voltage, but may not correspond to a DC voltage since a voltage fluctuation is generated.

As described above, the voltage fluctuation of the base voltage EVSS may be mainly generated in the DC-DC converter and may be referred to as switching noise (DC-DC switching noise) generated in the DC-DC converter, or may be simply referred to as noise.

Referring to FIGS. 5 and 6, when the base voltage EVSS does not have a constant voltage value EVSS_ref but has a fluctuating voltage value due to noise, the OLED current Ioled flowing to the OLED also does not have a constant current value Ioled_ref but fluctuates.

Referring to FIG. 6, as the base voltage EVSS increases, the OLED current Ioled may decrease. When the base voltage EVSS is lowered, the OLED current Ioled may increase.

Such fluctuation (variation) of the OLED current does not cause the OLED to emit light having a desired level of luminance. This may result in a total or partial image quality degradation.

Thus, according to the present embodiments, it is possible to provide a method of preventing image quality degradation phenomenon even if a fluctuation in the ground voltage EVSS due to noise occurs. Hereinafter, a method for preventing image quality degradation due to a fluctuation in the base voltage EVSS due to noise will be described in detail.

Figure 7:
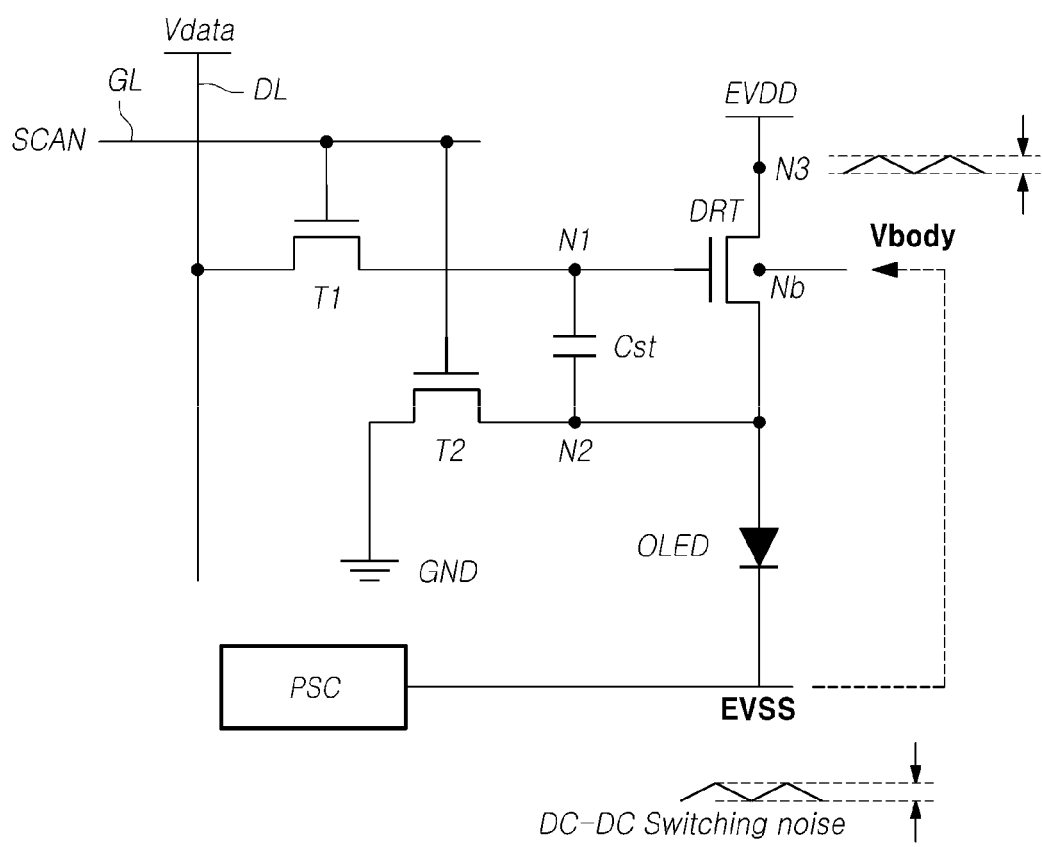
FIG. 7 is a view illustrating a body-biasing technique for preventing an image quality degradation phenomenon due to fluctuation of a base voltage due to noise in an OLED display device according to embodiments disclosed herein.

FIG. 7 is a diagram illustrating a body-biasing technique for preventing image quality degradation due to a fluctuation in the base voltage EVSS due to noise in the OLED display device 100 according to the embodiments.

In the OLED display device 100 according to the embodiments, a body voltage Vbody corresponding to the base voltage EVSS corresponding to the common voltage Vcom commonly applied to the plurality of sub-pixels SP may be applied to the body Nb of the driving transistor DRT in order to prevent image quality degradation phenomenon due to a fluctuation in the base voltage EVSS due to noise.

As described above, a method of applying the body voltage Vbody corresponding to the base voltage EVSS to the body Nb of the driving transistor DRT is referred to as body biasing.

According to this body biasing, the body voltage Vbody applied to the body Nb of the driving transistor DRT may have a waveform corresponding to the waveform of the base voltage EVSS corresponding to the common voltage Vcom.

Accordingly, even if the base voltage EVSS fluctuates due to noise, the body voltage Vbody of the driving transistor DRT also fluctuates, thereby reducing the influence of a fluctuation in the base voltage EVSS due to noise.

When the body voltage Vbody corresponding to the base voltage EVSS, which fluctuates due to noise, is applied to the body Nb of the driving transistor DRT, that is, when the fluctuating body voltage Vbody is applied to the body Nb of the driving transistor DRT, the threshold voltage Vth of the driving transistor DRT may increase or decrease according to the magnitude of the body voltage Vbody, as can be seen from Equation 1 as follows.

$$Vth = Vtho + \gamma(\sqrt{2\varphi f + Vsb} - \sqrt{2\varphi f}) \qquad \text{Equation 1}$$

In Equation 1, Vsb is a reverse substrate bias voltage. Vsb is associated with the fluctuation of the body voltage Vbody (i.e., the fluctuation of the base voltage EVSS due to a noise component of the base voltage EVSS). Vsb becomes 0 (zero) when there is no fluctuation in the body voltage Vbody.

In Equation 1, Vth is the threshold voltage of the driving transistor DRT which fluctuates according to the fluctuation of the body voltage Vbody. Vtho is the threshold voltage of the driving transistor DRT when there is no fluctuation in the body voltage Vbody (i.e., when Vsb=0).

In Equation 1, $\gamma$ is a fabrication-process parameter and is also referred to as a body-effect parameter. $\varphi f$ is a physical parameter and is also referred to as a Fermi potential of the substrate.

By increasing or decreasing the threshold voltage Vth of the driving transistor DRT through the above-described body biasing, it is possible to reduce or prevent the current fluctuation, which may be caused by the fluctuation of the base voltage EVSS due to the noise generated when the DC-DC converter of the power supply circuit PSC generates the base voltage EVSS.

Figure 8:
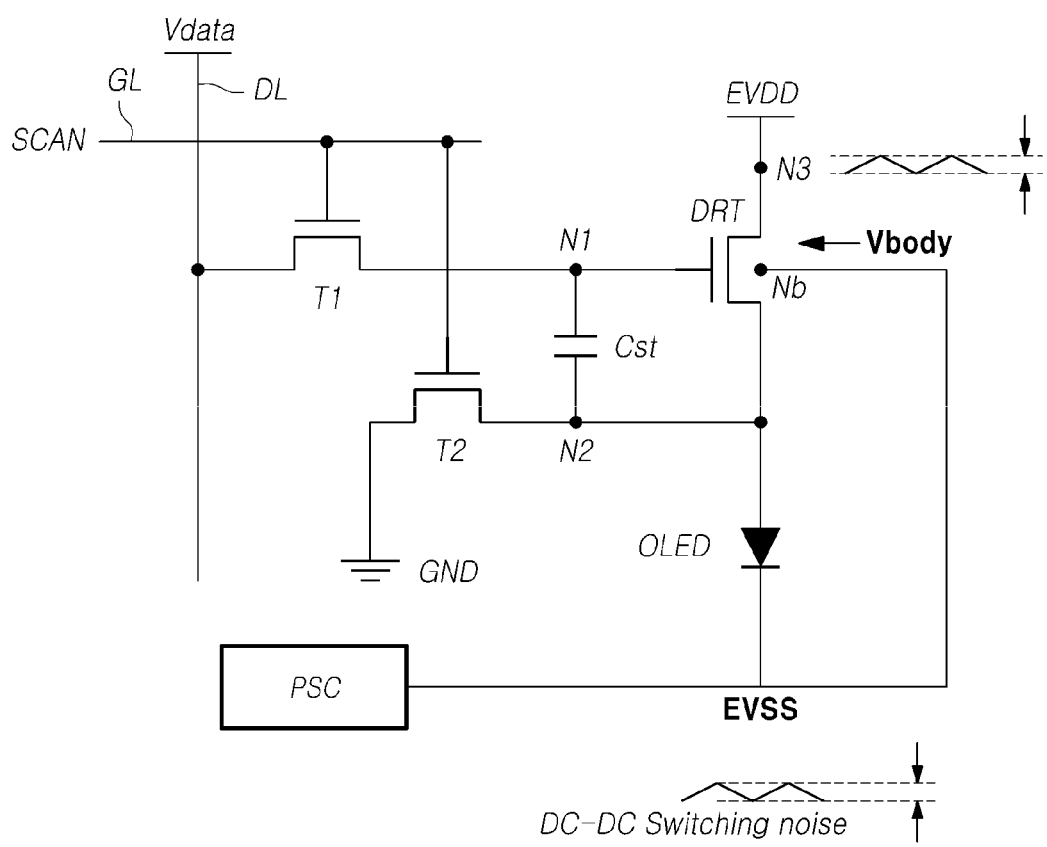
FIG. 8 is a diagram illustrating a simple body-biasing technique in an OLED display device according to embodiments disclosed herein.

FIG. 8 is a diagram illustrating a simple body-biasing technique in the OLED display device 100 according to the embodiments.

Referring to FIG. 8, in the OLED display device 100 according to the embodiments, an output stage from which the base voltage EVSS is output in the power supply circuit PSC may be directly connected to the body Nb of the driving transistor DRT.

In this case, the base voltage EVSS output from the power supply circuit PSC is applied to the second electrode E2 of the OLED in the pixel array 110. In addition, the base voltage EVSS output from the power supply circuit PSC is also applied to the body Nb of the driving transistor DRT as the body voltage Vbody.

Therefore, the power supply circuit PSC may supply the base voltage EVSS corresponding to the common voltage Vcom to the second electrode E2 (e.g., the cathode electrode) of the OLED, and may also supply the body voltage Vbody corresponding to the common voltage Vcom to the body Nb of the driving transistor DRT.

According to this, the OLED display device 100 is able to provide simple body biasing without adding a separate circuit between the output stage from which the base voltage EVSS is output in the power supply circuit PSC and the body Nb of the driving transistor DRT.

Figure 9:
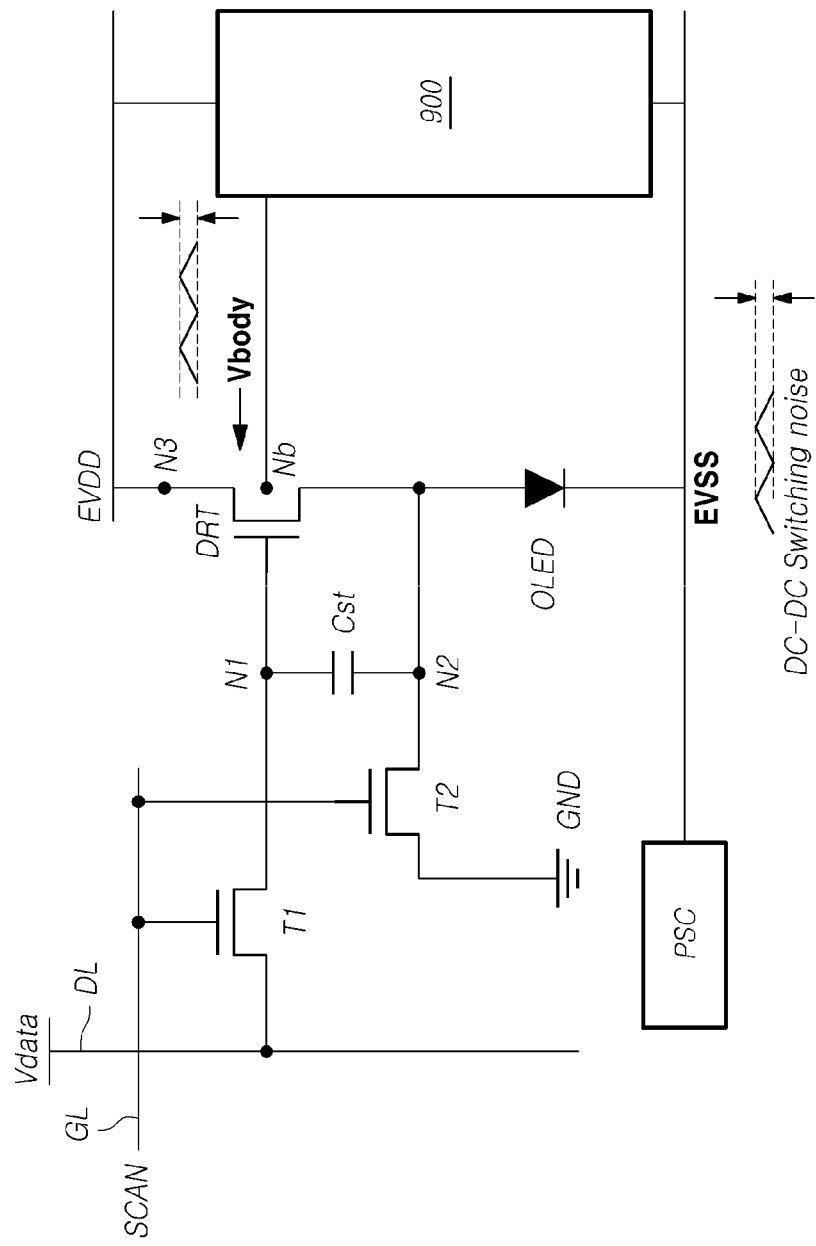
FIG. 9 is a diagram illustrating a body-biasing circuit for an adaptive body-biasing technique in an OLED display device according to embodiments disclosed herein.
Figure 10:
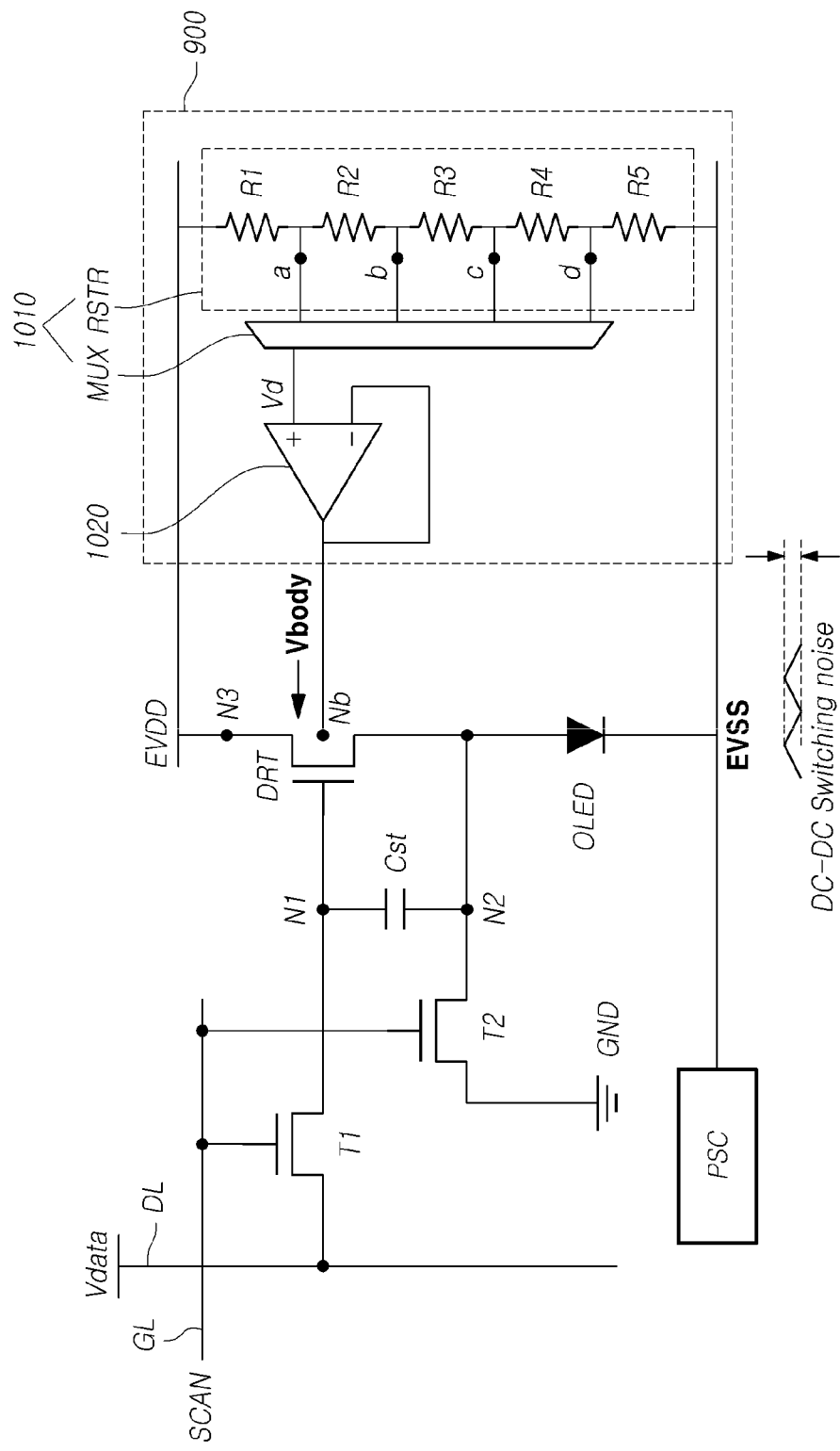
FIG. 10 is a diagram illustrating in more detail a body-biasing circuit for an adaptive body-biasing technique in the OLED display device according to embodiments disclosed herein.

FIG. 9 is a diagram illustrating a body-biasing circuit 900 for an adaptive body-biasing technique in the organic light-emitting display diode display 100 according to the embodiments. FIG. 10 is a diagram illustrating in more detail a body-biasing circuit 900 for an adaptive body-biasing technique in the OLED display device 100 according to the embodiments. FIG. 11 illustrates examples of the body voltage Vbody of the driving transistor DRT when the body-biasing circuit 900 for the adaptive body-biasing technique is applied in the OLED display device 100 according to the embodiments.

Referring to FIG. 9, the OLED display device 100 according to the embodiments may further include a body-biasing circuit 900 connected between the body Nb of the driving transistor DRT and the power supply circuit PSC.

The body-biasing circuit 900 may apply the body voltage Vbody corresponding to the base voltage EVSS corresponding to the common voltage Vcom to the body Nb of the driving transistor DRT.

That is, the body-biasing circuit 900 may receive the base voltage EVSS output from the power supply circuit PSC, may generate the body voltage Vbody corresponding to the base voltage EVSS, and may apply the generated body voltage Vbody to the body Nb of each driving transistor DRT in the pixel array 110.

By using the body-biasing circuit 900 described above, it is possible to adaptively control the body voltage Vbody with respect to the situation in which the fluctuation of the base voltage EVSS is dynamically generated, using the base voltage EVSS output from the power supply circuit PSC, and to apply the body voltage Vbody to the body Nb of the driving transistor DRT.

Referring to FIG. 10, the body-biasing circuit 900 may include a voltage distribution circuit 1010, an output circuit 1020, etc. for outputting a distributed voltage Vd between a driving voltage for driving a sub-pixel SP and a base voltage EVSS.

The voltage distribution circuit 1010 may output a distributed voltage Vd between a driving voltage EVDD applied to the third node N3 of the driving transistor DRT and the base voltage EVSS.

The output circuit 1020 may output a body voltage Vbody corresponding to the distributed voltage Vd or a body voltage Vbody obtained by amplifying the distributed voltage Vd to the body Nb of the driving transistor DRT.

Here, the output circuit 1020 may include an amplifier.

The voltage distribution circuit 1010 may include a resistor string RSTR including a plurality of resistors R1, R2, R3, R4, and R5 connected between a driving voltage and the base voltage EVSS, and a switching circuit (MUX) configured to select any one point among a plurality of points a, b, c, and d in the resistor string RSTR and to electrically connect the selected point to the input node of the output circuit 1020.

The switching operation of the switching circuit MUX may be controlled by a controller CONT or by a control unit existing inside or outside the body-biasing circuit 900.

Accordingly, a reference body voltage value Vbody_ref, an amplitude, etc. of the body voltage Vbody can be controlled.

Referring to FIG. 11, for example, when the switch circuit MUX connects the point a among the plurality of points a, b, c, and d in the resistor string RSTR to the input node of the output circuit 1020 (case 1), the body voltage Vbody_a has a first reference body voltage value Vbody_ref_a and a first body voltage amplitude AMPa.

In this case, the body voltage Vbody_a is represented by Equation 2 as follows. In Equation 2, K is a voltage amplification gain in the output circuit 1020.

$$\text{Vbody\_a} = K \times \frac{R2 + \ldots + R5}{R1 + R2 + \ldots + R5} \times (EVDD - EVSS) \quad \text{Equation 2}$$

When the switch circuit MUX connects the point d among the plurality of points a, b, c, and d in the resistor string RSTR to the input node of the output circuit 1020 (case 2), the body voltage Vbody_d has a second reference body voltage value Vbody_ref_d and a second body voltage amplitude AMPd.

In this case, the body voltage Vbody_d is represented by Equation 3 as follows. In Equation 3, K is a voltage amplification gain in the output circuit 1020.

$$\text{Vbody\_d} = K \times \frac{R5}{R1 + R2 + \ldots + R5} \times (EVDD - EVSS) \quad \text{Equation 3}$$

The first body voltage amplitude AMPa of the body voltage Vbody_a in the case where the switch circuit MUX connects the point a in the resistor string RSTR to the input node of the output circuit 1020 (case 1) may be greater than the second body voltage amplitude AMPd of the body voltage Vbody_d in the case where the switch circuit MUX connects the point d in the resistor string RSTR to the input node of the output circuit 1020 (case 2).

The first reference body voltage Vbody_ref_a of the body voltage Vbody_a in the case where the switch circuit MUX connects the point a in the resistor string RSTR to the input node of the output circuit 1020 (case 1) may be equal to or different from the second body voltage value Vbody_ref_b of the body voltage Vbody_d in the case where the switch circuit MUX connects the point d in the resistor string RSTR to the input node of the output circuit 1020 (case 2).

Figure 12:
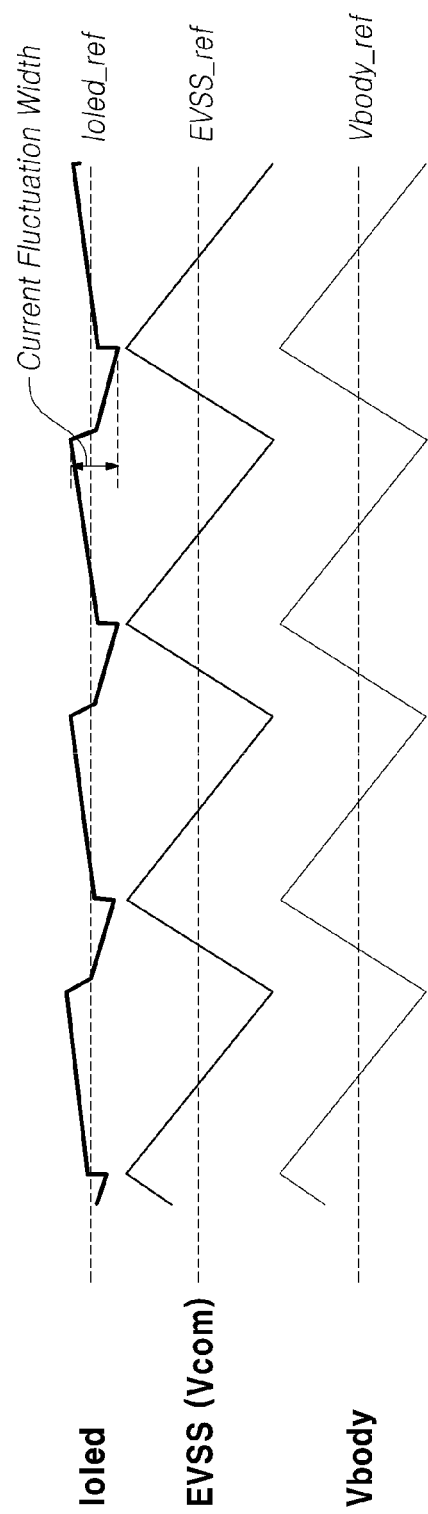
FIG. 12 is a diagram illustrating a base voltage in which noises are generated, a body voltage in the case where a body-biasing technique is applied, and a variation in current, in an OLED in the OLED display device according to embodiments disclosed herein.

FIG. 12 is a diagram a base voltage EVSS in which noise is generated, a body voltage Vbody when the body-biasing technique is applied, and a variation in the current of the OLED in the OLED display device 100 according to the embodiments.

The base voltage EVSS corresponding to the common voltage Vcom does not have a constant reference base voltage value EVSS_ref (the voltage value output from the power supply circuit PDC), and is fluctuated by the noise generated by the voltage generating operation of a DC-DC converter.

A body voltage Vbody corresponding to the fluctuating base voltage EVSS is applied to the body Nb of the driving transistor DRT.

Here, the body voltage Vbody may have a reference body voltage value Vbody_ref and a body voltage amplitude.

The base voltage EVSS corresponding to the reference body voltage value Vbody_ref may be equal to or different from the constant base reference voltage value EVSS_ref.

The body voltage amplitude may be equal to or different from the amplitude of the base voltage EVSS.

Meanwhile, the body voltage Vbody may have a waveform corresponding to the waveform of the base voltage EVSS corresponding to the common voltage Vcom.

Meanwhile, the body voltage Vbody may have an amplitude that varies according to the variation of the amplitude of the base voltage EVSS corresponding to the common voltage Vcom.

As described above, the body voltage Vbody corresponding to the base voltage EVSS, which varies by noise, is applied to the body Nb of the driving transistor DRT, so that a variation in the threshold voltage of the driving transistor DRT occurs (see Equation 1), the fluctuation width of the current Ioled flowing in the OLED can be reduced, as illustrated in FIG. 12.

In other words, the fluctuation with of the current when the body-biasing technique is applied as illustrated in FIG. 12 can be considerably reduced in comparison with the fluctuation width of the current when the body-biasing technique is not applied as illustrated in FIG. 6 (e.g., reduced by about 1/0).

The organic light-emitting display device 100 described above may be an ordinary display in which a pixel array PXL is present in a display panel using a glass substrate or the like, and the source driving circuit SDC, the gate driving circuit GDC, etc. are electrically connected to the display panel in various ways.

Alternatively, the OLED display device 100 may be a micro-display, which is manufactured in a very small size and utilized for an electronic device such as a virtual reality device or an augmented reality device.

Hereinafter, an electronic device using a micro-display-type OLED display device 100 will be described below.

Figure 13:
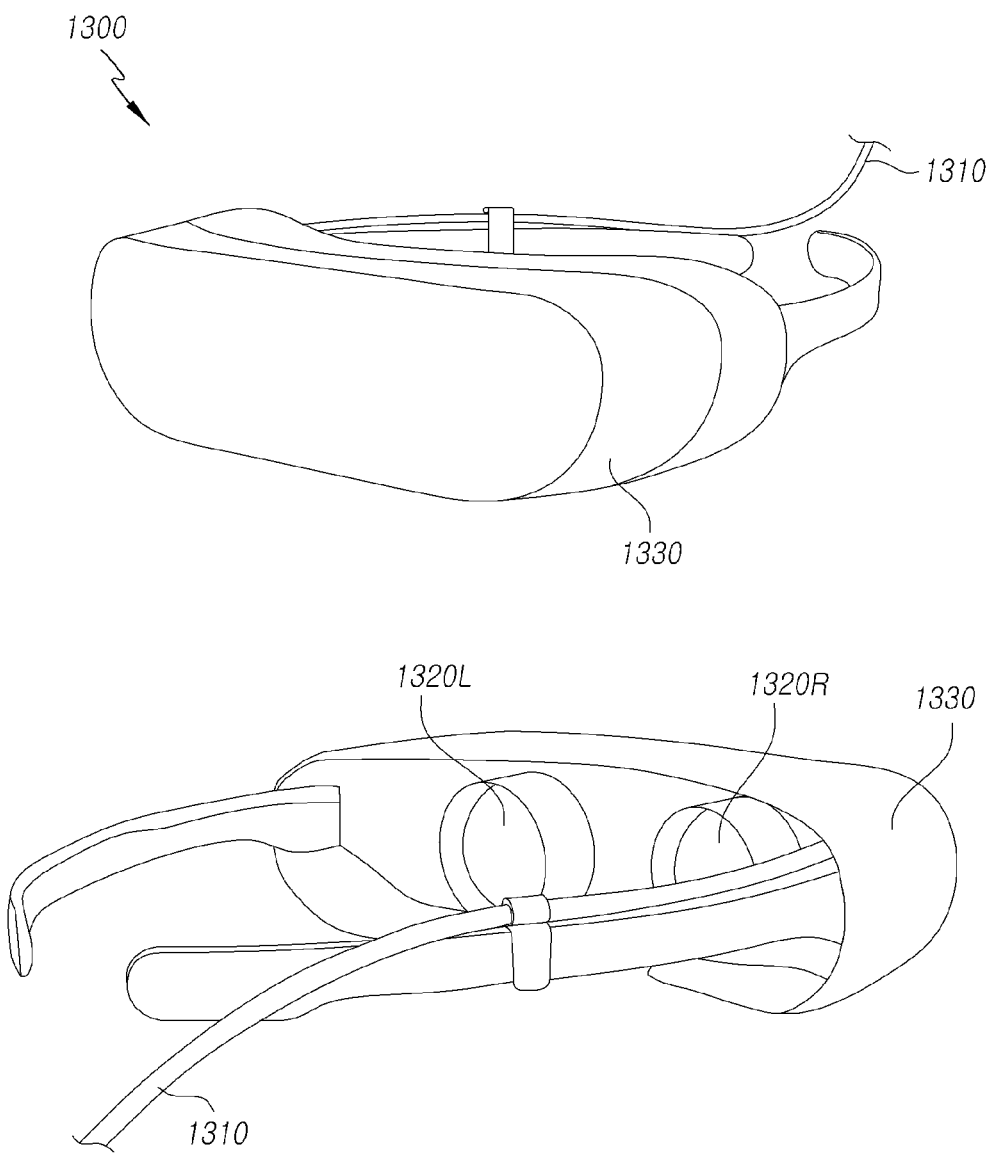
FIG. 13 is a diagram illustrating an electronic device using an OLED display device according to embodiments disclosed herein.

FIG. 13 is a diagram illustrating an electronic device 1300 using the OLED display device 100 according to embodiments.

Referring to FIG. 13, the electronic device 1300 according to the embodiments is a headset-type device for displaying an augmented reality or virtual reality image.

The electronic device 1300 according to the embodiments may include an image signal input unit 1310 to which an image signal is input, a first display unit 1320L configured to display a first image (e.g., a left eye image) based on the image signal, a second display unit 1320R configured to display a second image (e.g., a right eye image) based on the image signal, and a case 1330 configured to receive the image signal input unit 1310, the first display unit 1320L, and the second display unit 1320R (1330), and the like.

The image signal input unit 1310 may include a wired cable or a wireless communication module connected to a terminal (e.g., a smart phone) that outputs image data.

The first display unit 1320L and the second display unit 1320R are display constructions located at positions corresponding to the user's left and right eyes.

Each of the first display unit 1320L and the second display unit 1320R may include all or a part of the OLED display device 100.

Figure 14:
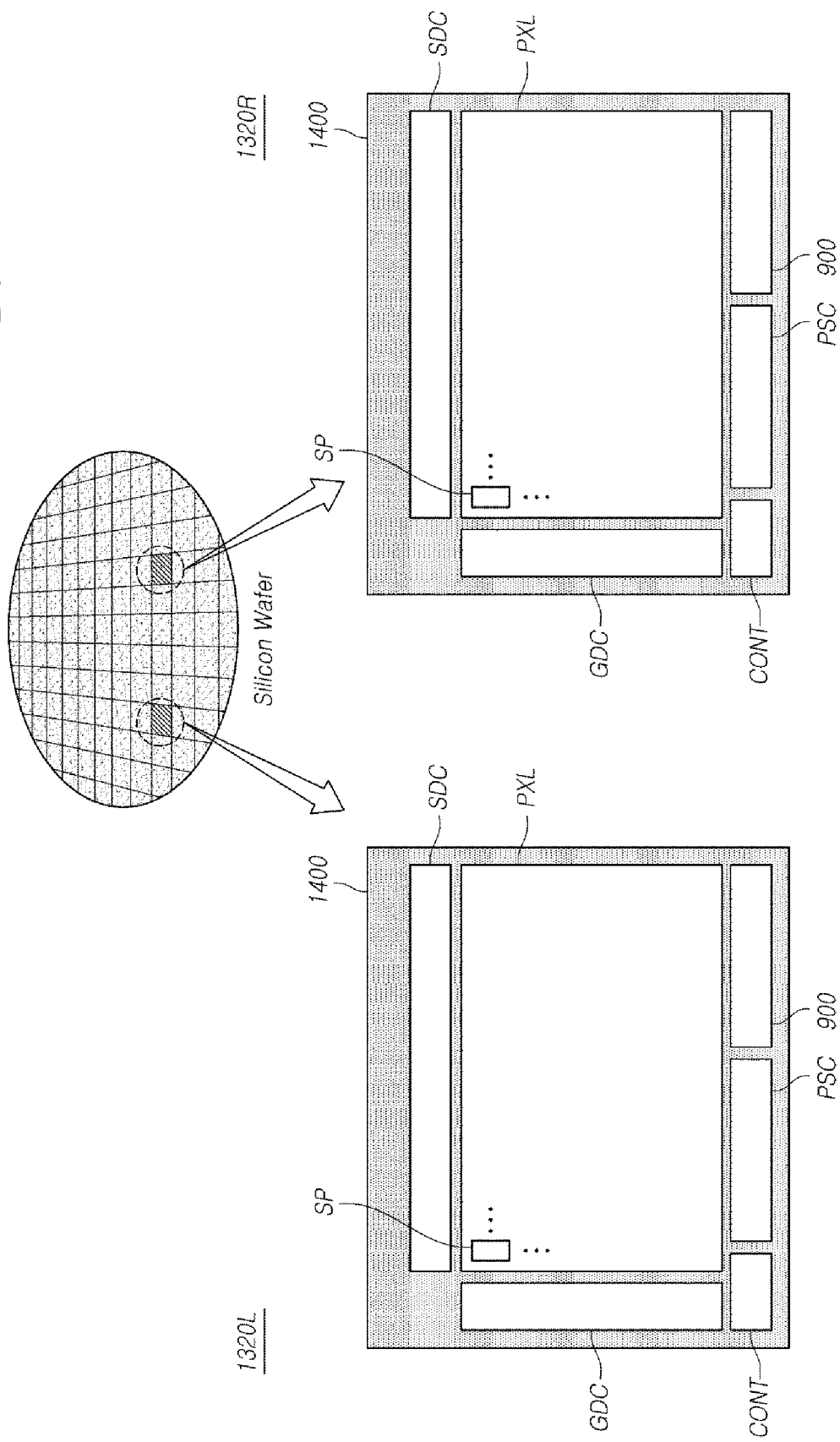
FIG. 14 is a diagram illustrating an example of implementation of each of the first display unit and the second display unit of the electronic device according to embodiments disclosed herein.

FIG. 14 is a diagram illustrating an example of implementation of each of the first display unit 1320L and the second display unit 1320R of the electronic device 1300 according to the embodiments.

Referring to FIG. 14, each of the first display unit 1320L and the second display unit 1320R of the electronic device 1300 according to the embodiments may include a silicon substrate 1400, a pixel array PXL including a plurality of sub-pixels SP arranged on the pixel array region of the substrate 1400, and driving circuits SDC, GDC, CONT, etc. arranged on the circuit region of the silicon substrate 1400.

The first display unit 1320L and the second display unit 1320R of the electronic device 1300 according to the embodiments may be fabricated from the same silicon wafer or different silicon wafers through a semiconductor process.

The electronic device 1300 according to the embodiments may perform body biasing.

The electronic device 1300 according to the embodiments is configured such that in each of the first display unit 1320L and the second display unit 1320R, the body voltage Vbody corresponding to the base voltage EVSS corresponding to the common voltage Vcom applied to the plurality of sub-pixels SP may be applied to the body Nb of the driving transistor DRT in each of the plurality of sub-pixels SP through the body biasing.

Through the above-described body biasing, the electronic device 1300 is able to prevent image quality degradation due to the fluctuation of the base voltage EVSS, even when the base voltage EVSS fluctuates due to the noise generated during the generation of the base voltage EVSS.

As described above, the electronic device 1300 according to the embodiments may be an augmented reality device or a virtual reality device.

Therefore, by using the electronic device 1300 according to the embodiments, the user may enjoy a more realistic augmented reality or virtual reality.

Meanwhile, the electronic device 1300 according to the embodiments may further include a power supply circuit PSC configured to supply a voltage required for operating each of the first display unit 1320L and the second display unit 1320R, and a body-biasing circuit 900 configured to supply the body voltage Vbody to the body Nb of the driving transistor DRT in each of the first display unit 1320L and the second display unit 1320R.

The power supply circuit PSC may exist to correspond to each of the first display unit 1320L and the second display unit 1320R. Alternatively, the first display unit 1320L and the second display unit 1320R may share the power supply circuit PSC.

That is, one or two power supply circuits PSC may exist.

The power supply circuit PSC may be included in the first display unit 1320L and/or the second display unit 1320R. That is, the power supply circuit PSC may be located on the silicon substrate 1400 of the first display unit 1320L and/or the silicon substrate 1400 of the second display unit 1320R.

Meanwhile, the power supply circuit PSC may include one or more power-related circuits. In this case, a portion of the power supply circuit PSC may exist outside the first display unit 1320L and/or the second display unit 1320R.

The body-biasing circuit 900 may exist to correspond to each of the first display unit 1320L and the second display unit 1320R. Alternatively, the first display unit 1320L and the second display unit 1320R may share the body-biasing circuit 900.

That is, one or two body-biasing circuits 900 may exist.

The body-biasing circuit 900 may be included in the first display unit 1320L and/or the second display unit 1320R. That is, the body-biasing circuit 900 may be located on the silicon substrate 1400 of the first display unit 1320L and/or the silicon substrate 1400 of the second display unit 1320R.

Meanwhile, some components of the body-biasing circuit 900 may exist outside the first display unit 1320L and/or the second display unit 1320R.

The body-biasing circuit 900 may be connected between the body Nb of the driving transistor DRT and the power supply circuit PSC and may apply the body voltage Vbody corresponding to the common voltage Vcom to the body Nb of the driving transistor DRT.

As described above, the body-biasing circuit 900 may include a voltage distribution circuit 1010 configured to output a distributed voltage Vd between the driving voltage EVDD applied to the third node N3 of the driving transistor DRT and the common voltage Vcom, an output circuit 1020 configured to output a body voltage Vbody corresponding to the distributed voltage Vd or a body voltage Vbody obtained by amplifying the distributed voltage Vd to the body Nb of the driving transistor DRT, and the like.

Figure 15:
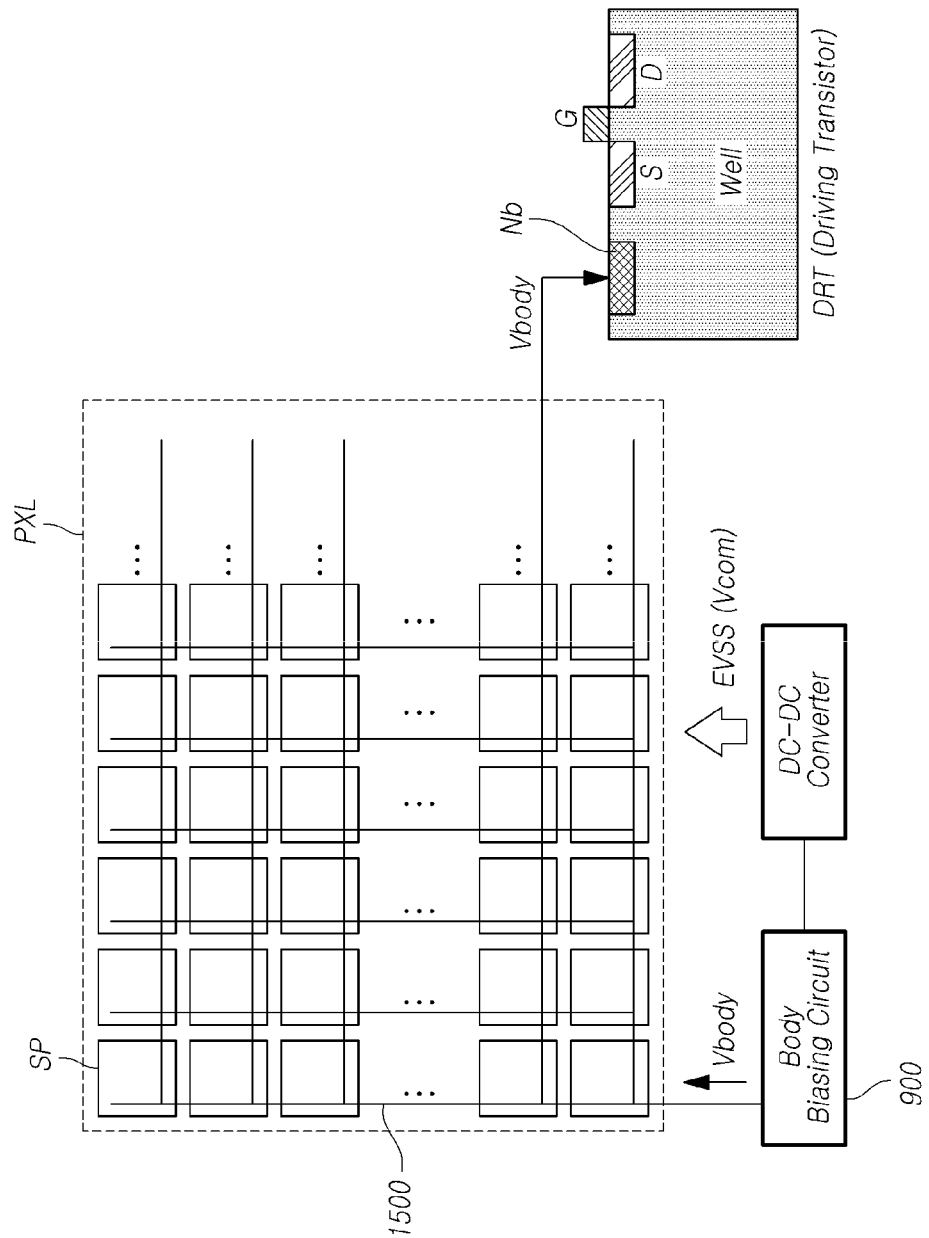
FIG. 15 is a diagram illustrating a body voltage applying structure of a driving transistor in each of the first display unit and the second display unit of the electronic apparatus according to embodiments disclosed herein.

FIG. 15 is a diagram illustrating a body voltage applying structure of the driving transistor DRT in each of the first display unit 1320L and the second display unit 1320R of the electronic device 1300 according to the embodiments.

Body biasing may be performed in each of the first display unit 1320L and the second display unit 1320R of the electronic device 1300 according to the embodiments.

A second electrode E2 to which the base voltage EVSS is applied may be disposed on the front face of the pixel array region in each of the first display unit 1320L and the second display unit 1320R of the electronic device 1300 according to the embodiments.

The power supply circuit PSC may include a DC-DC converter configured to generate and output the base voltage EVSS.

Noise may occur when the DC-DC converter generates the base voltage EVSS.

Accordingly, the base voltage EVSS output from the DC-DC converter includes a noise component, so that the voltage value fluctuates rather than being constant.

The fluctuation of the base voltage EVSS causes a variation in the current Ioled flowing in the OLED, which may degrade the image quality.

In order to prevent this, the electronic device 1300 according to the embodiments may include a body-biasing structure.

In each of the first display unit 1320L and the second display unit 1320R of the electronic device 1300 according to the embodiments, a connection pattern 1500 may be disposed to electrically connect the body-biasing circuit 900 and the body Nb of the driving transistor DRT in each sub-pixel to each other.

The body voltage Vbody outputted from the body-biasing circuit 900 is applied to the body Nb of each driving transistor DRT through the connection pattern 1500.

Meanwhile, as illustrated in FIG. 15, since the pixel array PXL and driving circuits (SDC, GDC, CONT, and the like) are disposed on the silicon substrate 1400 in each of the first display unit 1320L and the second display unit 1320R of the electronic device 1300 according to the embodiments, the driving transistors DRT disposed in the pixel array PXL may be of a Metal-Oxide-Semiconductor Field-Effect Transistor (MOSFET) type, which may be formed in a semiconductor process, like the transistors in the driving circuits. Here, the MOSFET type may include a Complementary Metal-Oxide Semiconductor (CMOS). In some cases, the driving transistors DRT disposed in the pixel array PXL may be any one of various TFTs a polysilicon TFT such as an amorphous silicon TFT or a Low-Temperature Polycrystalline Silicon (LTPS), an oxide TFT, and an organic TFT.

Therefore, in each of the first display unit 1320L and the second display unit 1320R of the electronic device 1300 according to the embodiments, not only the transistors included in the driving circuits (SDC, GDC, CONT, etc.), but also the transistors (DRT, T1, T2, etc.) in the pixel array PXL may also be formed together on the silicon substrate 1400 in a semiconductor process.

Figure 16:
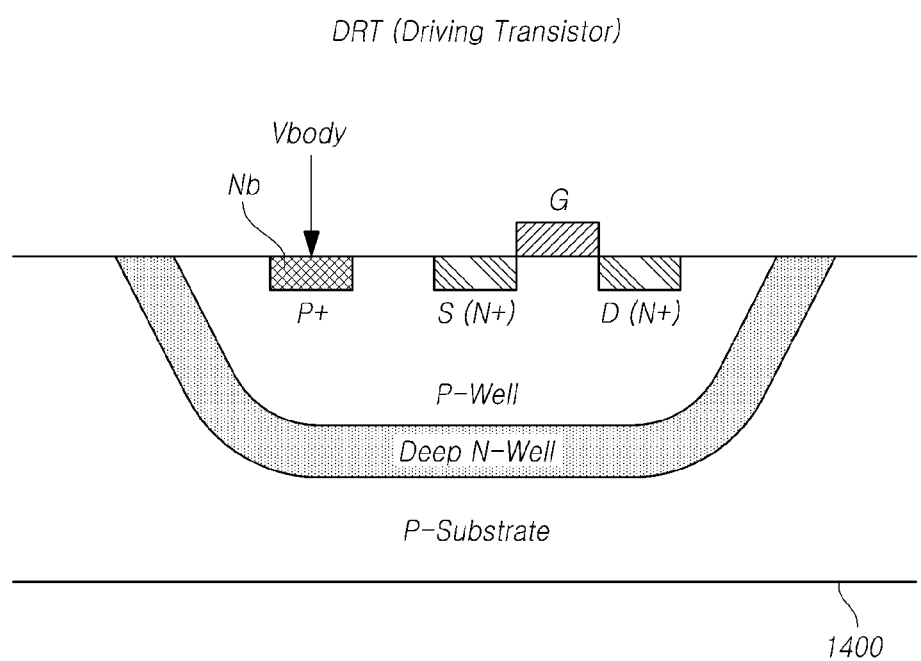
FIGS. 16 and 17 are simple cross-sectional views of regions where MOSFET-type driving transistors are formed in the first display unit and the second display unit of the electronic device according to embodiments disclosed herein, respectively.
Figure 17:
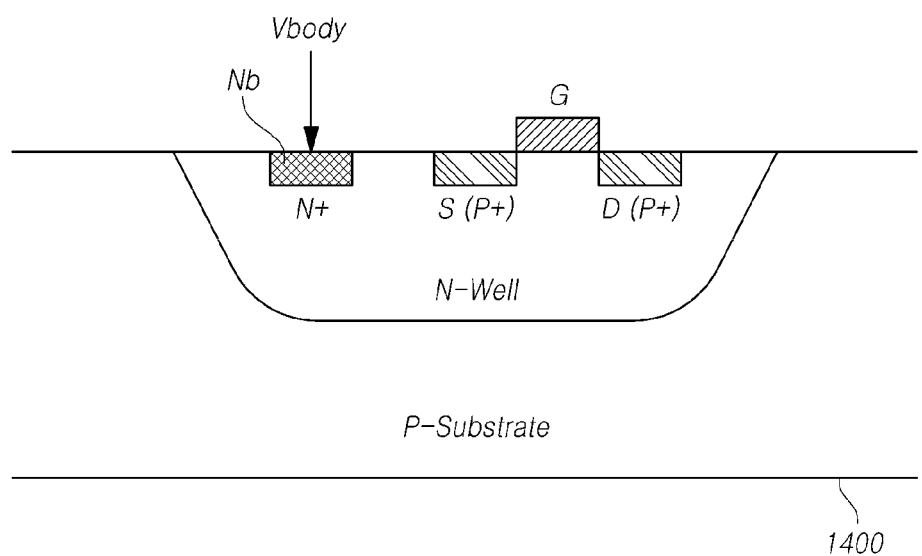

FIGS. 16 and 17 are simple cross-sectional views of regions where MOSFET-type driving transistors DRT are famed in each of the first display unit 1320L and the second display unit 1320R of the electronic device 1300 according to the embodiments, respectively.

Referring to the cross-sectional view of FIG. 16, a driving transistor DRT, which is an N-type MOSFET (an N-channel MOSFET), is formed in the pixel array region of the silicon substrate 1400.

For example, the silicon substrate 10 may be a P-type substrate (P-Substrate).

In the silicon substrate 1400, an N+ source region and an N+ drain region are formed at positions corresponding to the source electrode S and the drain electrode D of the driving transistor DRT. An N-channel may be formed between the N+ source region and the N+ drain region.

Between the N+ source region and the N+ drain region, which correspond to the source electrode S and the drain electrode D, respectively, a gate electrode G may be present above or below the layer in which the N+ source region and the N+ drain region are present. Here, FIG. 16 is a conceptually briefly illustrated view, and an insulating layer, a planarization layer, and the like may further be present.

On the other hand, the driving transistor DRT corresponding to an MOSFET may be formed directly on the silicon substrate 1400, but may be formed in one or more wells. Such a "well" may be a P-well (P-type well) or an N-well (N-type well) depending on the type of the silicon substrate 140 (N-type or P-type), or the MOSFET.

For example, as illustrated in FIG. 16, a deep N-well may be formed on a silicon substrate 1400 which is a P-substrate, and a P-well may be formed in the deep N-well. An N+ source region and an N+ drain region corresponding to the source electrode S and the drain electrode D may be formed in the P-well.

On the other hand, the body Nb (also referred to as a "body electrode") of the driving transistor DRT may be positioned in the P-well in a P+ type.

A body voltage (Vbody) for body biasing is applied to the P+ type body Nb.

On the other hand, one driving transistor DRT may be present in one P-well, or two or more driving transistors DRT may exist in one P-well.

One P-well may be present in one deep N-Well may have one P-Well, or two or more P-Wells may be present in one deep N-well.

Referring to the cross-sectional view of FIG. 17, a driving transistor DRT, which is a P-type MOSFET (P-channel MOSFET), is famed in the pixel array region of the silicon substrate 1400.

For example, the silicon substrate 10 may be a P-type substrate (P-Substrate).

In the silicon substrate 1400, a P+ source region and a P+ drain region are formed at positions corresponding to the source electrode S and the drain electrode D of the driving transistor DRT. A P-channel may be formed between the P+ source region and the P+ drain region.

Between the P+ source region and the P+ drain region, which correspond to the source electrode S and the drain electrode D, respectively, a gate electrode G may be present above or below the layer in which the P+ source region and the P+ drain region are present. Here, FIG. 17 is a conceptually briefly illustrated view, and an insulating layer, a planarization layer, and the like may further be present.

On the other hand, the driving transistor DRT corresponding to an MOSFET may be directly foamed on the silicon substrate 1400, but may be formed in one or more wells. Such a "well" may be a P-well (P-type well) or an N-well (N-type well) depending on the type of the silicon substrate 140 (N-type or P-type), or the MOSFET.

For example, as illustrated in FIG. 17, an N-well may be formed on the silicon substrate 1400, which is a P-substrate. A P+ source region and a P+ drain region, which correspond to the source electrode S and the drain electrode D, respectively, may be formed in the N-well.

On the other hand, the body Nb (also referred to as a "body electrode") of the driving transistor DRT may be positioned in the N-well in a N+ type.

A body voltage Vbody for body biasing is applied to the N+ type body Nb.

On the other hand, one driving transistor DRT may be present in one N-well, or two or more driving transistors DRT may exist in one N-well.

According to embodiments disclosed herein, it is possible to provide a display device 100, an electronic device 1300, and a body-biasing circuit 900, in which, even when fluctuation of a common voltage occurs due to noise, image quality degradation due to the fluctuation of the common voltage can be prevented.

According to embodiments disclosed herein, it is possible to provide a display device 100, an electronic device 1300, and a body-biasing circuit 900, in which, even when fluctuation of a common voltage occurs due to noise, an increase in a variation width of the current flowing in an OLED due to the fluctuation of the common voltage can be prevented.

According to embodiments disclosed herein, it is possible to provide a display device 100, an electronic device 1300, and a body-biasing circuit 900 that can be applied to a virtual reality device or an augmented reality device and provide excellent image quality.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A display device comprising:
a pixel array comprising a plurality of sub-pixels defined by a plurality of data lines and a plurality of gate lines;
a plurality of driving transistors, each configured to drive a light emitting element of a corresponding sub-pixel of the plurality of sub-pixels, and configured to receive a driving voltage;
a source driving circuit configured to drive the plurality of data lines;
a gate driving circuit configured to drive the plurality of gate lines;
a controller configured to control the source driving circuit and the gate driving circuit;
a power supply circuit configured to output the common voltage; and
a circuit configured to:
receive a common voltage commonly applied to the plurality of sub-pixels,
receive the driving voltage, and
apply a body voltage corresponding to the common voltage to a body of a driving transistor of the plurality of driving transistors, wherein the body voltage is between the common voltage and the driving voltage, wherein the body voltage has an amplitude that varies according to a variation of an amplitude of the common voltage, and wherein the circuit is a body biasing circuit connected between the body of the driving transistor and the power supply circuit.

2. The display device of claim 1, wherein the body voltage has an amplitude that varies according to a variation of an amplitude of the common voltage.

3. The display device of claim 1, wherein each of the plurality of sub-pixels comprises an organic light-emitting diode driven by the driving transistor and having an anode electrode and a cathode electrode, and
wherein the common voltage is a base voltage applied to the cathode electrode.

4. The display device of claim 1, wherein the body-biasing circuit comprises:
a voltage distribution circuit configured to output a distributed voltage between the driving voltage applied to a drain node or a source node of the driving transistor and the common voltage; and
an output circuit configured to output the body voltage corresponding to the distributed voltage or the body voltage obtained by amplifying the distributed voltage to the body of the driving transistor.

5. The display device of claim 1, wherein the power supply circuit comprises a DC-DC converter.

6. The display device of claim 1, further comprising:
a power supply circuit configured to supply the common voltage.

7. The display device of claim 1, wherein the pixel array, the source driving circuit, the gate driving circuit, and the controller are disposed on a silicon substrate.

8. A body-biasing circuit comprising:
a driving transistor configured to receive a driving voltage for driving a light emitting element of a sub-pixel;
a voltage distribution circuit configured to:
receive the driving voltage,
receive a base voltage, and
output a distributed voltage between the driving voltage and the base voltage;
a power supply circuit configured to output the base voltage; and an output circuit configured to output the distributed voltage or a voltage obtained by amplifying the distributed voltage to a body of the driving transistor, wherein the distributed voltage or the voltage obtained by amplifying the distributed voltage has an amplitude that varies according to a variation of an amplitude of the base voltage, and wherein the output circuit is a body biasing circuit connected between the body of the driving transistor and the power supply circuit.

9. The body-biasing circuit of claim 8, wherein the voltage distribution circuit comprises:
   a resistor string connected between the driving voltage and the base voltage; and
   a switching circuit configured to connect one point of a plurality of points in the resistor string to an input node of the output circuit.

10. The body-biasing circuit of claim 8, wherein the sub-pixel comprises an organic light-emitting diode driven by the driving transistor, the organic light-emitting diode comprising an anode electrode and a cathode electrode, and
   wherein the base voltage is applied to the cathode electrode.

* * * * *